United States Patent [19]

Meng et al.

[11] Patent Number: 5,770,515
[45] Date of Patent: Jun. 23, 1998

[54] METHOD OF IN-SITU WAFER COOLING FOR A SEQUENTIAL WSI/ALPHA -SI SPUTTERING PROCESS

[75] Inventors: Hsien-Liang Meng; Elvis Huang; Pei-Jan Wang; Yeong Rvey Shiue, all of Hsin-Chu, Taiwan

[73] Assignee: Mosel Vitelic Incorporated, Hsin-Chu, Taiwan

[21] Appl. No.: 764,335

[22] Filed: Dec. 12, 1996

[51] Int. Cl.$^6$ .................................................. H01L 21/28
[52] U.S. Cl. ........................ 438/592; 438/655; 438/656; 438/908; 438/952; 204/192.17
[58] Field of Search .................................. 438/592, 655, 438/656, 657, 683, 952, 908, 353, 360; 204/192.17

[56] References Cited

U.S. PATENT DOCUMENTS 5,332,692   7/1994   Saitoh et al. .............................. 437/193
5,597,458   1/1997   Sanchez, Jr. et al. ............. 204/192.17

*Primary Examiner*—John Niebling
*Assistant Examiner*—Thomas G. Bilodean
*Attorney, Agent, or Firm*—Bacon & Thomas

[57] ABSTRACT

The present invention relates to a method of a sequencial WSi/α-Si sputtering process, more particularly to a method of in-situ wafer cooling for a sequencial WSi/α-Si sputtering process. A sputtering process of WSi and a sputtering process of α-Si are finished in a multi-chamber sputtering apparatus according to the invention; meanwhile, a wafer is cooled down by bolwing of inert gas before a process of sputtering α-Si starts. Thus, compared to traditional art of finishing WSi/α-Si sputtering in two apparatus, partial time of vacuuming and venting required in a sputtering process is saved according to the invention, thereby, shortening the production cycle time, reducing the possibility of wafer contamination, and suppressing the fabricating cost.

2 Claims, 1 Drawing Sheet

METHOD OF IN-SITU WAFER COOLING FOR A SEQUENTIAL WSI/ALPHA-SI SPUTTERING PROCESS

DESCRIPTION OF THE PRIOR ART

Many significant progresses have been recently made in developing gate structures and new material systems having low sheet resistivity to meet the requirement of the submicro IC (Integrated Circuit) process. More recently, refractory metals and their sides have been used in conjunction with polysilicon to reduce the resistance. Thus, a stacked structure of refractory silicide such as TiSi or WSi and underlying doped polysilicon layer (called polycide) has been widely used as a gate of a MOSFET(Metal-Oxide-Semiconductor Field Effect Transistor) to reduce gate resistance and raise its switching speed. It is ofthen difficult to obtain a faithful pattern on a WSi layer because a WSi layer has high reflectivity (>50% at i-line) and the amount of light that WSi reflects can partially expose some of photoresist, thereby an exact pattern of photoresist can't be obtained, especially at a recess region of a wafer. Besides, this problem become more significant as the patterns become finer because the amount of reflected light has a greater relative effect on exposing a thin line, which casts a narrow shadow, than a thick line, which casts a wide shadow.

To solve said problems, it is widely used to dispose an ARC(Anti-Reflective Coating) film on a WSi layer to reduce its reflectivity. Generally, ARC material is amorphous silicon (designated as $\alpha$-Si) formed by a LPCVD (Low Presure Chemical Vapor Deposition) method. The production cycle time is prolonged because an additional process of sputtering WSi is needed. Besides, a key factor that affects the reflectivity of WSi is how to maintain low growing temperature during a sputtering process because $\alpha$-Si can conserve its nature characteristics of rough surface only at low temperature thereby reducing its reflectivity; otherwise, surface of $\alpha$-Si would be smoothed at a higher temperature, thereby raising its reflectivity and loosing its antireflective effect. In fact, a wafer is heated to a temperature of 300° C. during a sputtering process; besides, a process of sputtering WSi and a process of sputtering $\alpha$-Si are separately finished in two sputtering apparatus. Hence, in traditional art, not only the production cycle tine is prolonged, but also the possibility of wafer contamination is raised, thereby reducing production yield and increasing fabricating cost. Therefore, how to maintain low temperature of sputtering $\alpha$-Si for its low reflectivity and how to shorten production cycle time for reducing fabricating cost are two key issues in raising product competence.

SUMMARY OF INVENTION

Therefore, an object of the invention is to provide a method of sequencial sputtering WSi/$\alpha$-Si which allows for shortening production cycle time, raising production yield, and reducing fabricating cost.

A further object of the invention is to provide a method of wafer cooling during a sputtering $\alpha$-Si process which allows for having rough surface of $\alpha$-Si to reducing its reflectivity, thereby improving the precision of the pattern in a WSi layer underneath an $\alpha$-Si layer.

According to the invention, a process of sputtering WSi and a process of sputtering $\alpha$-Si are finished in a multi-chamber sputtering apparatus; meanwhile, a wafer is cooled down by bolwing of inert gas before a process of sputtering $\alpha$-Si starts. Thus, compared to traditional art of finishing WSi/$\alpha$-Si sputtering in two separate apparatus, partial time of vacuuming and venting required in a sputtering process is saved according to the invention, thereby shortening the production cycle time, reducing the possibility of wafer contamination, and reducing the fabricating cost.

BRIEF DESCRIPTION OF THE DRAWINGS

The invention itseif, however, as well as other features and advantages thereof, will be best understood by reference to the detailed description which follows, read in conjunction with the accompanying drawings, wherein.

DESCRIPTION OF THE PREFERRED EMBODIMENT

Figure 1:
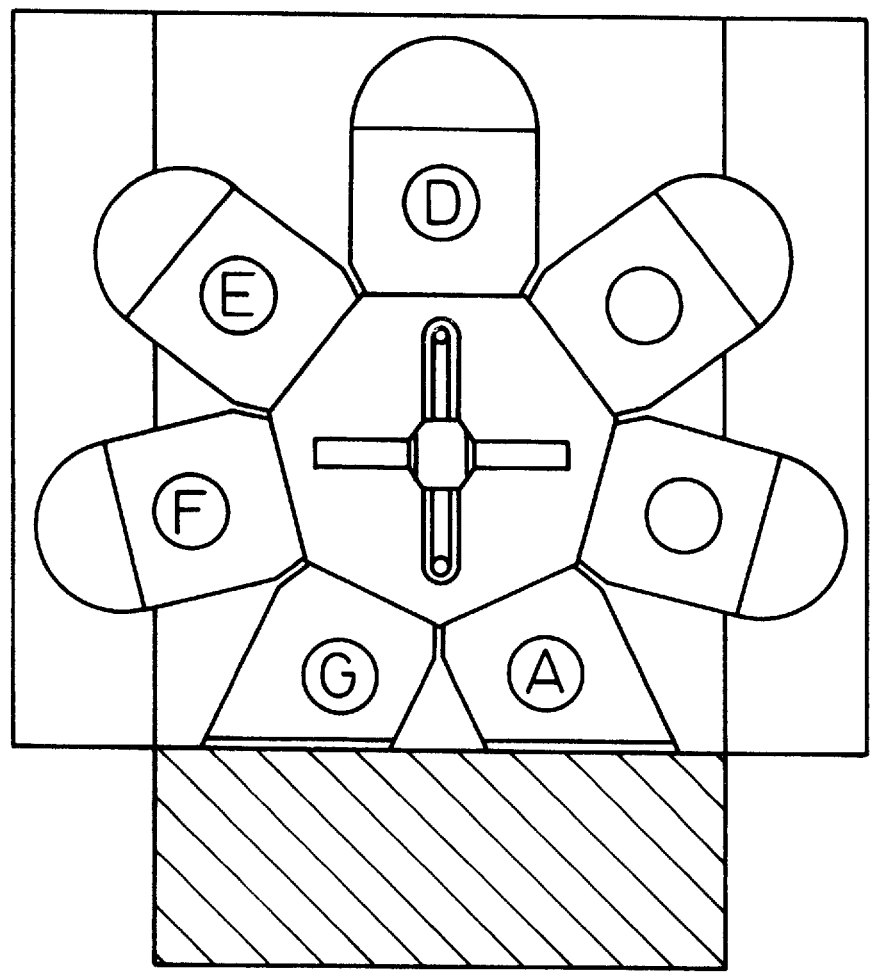
FIG.1 is a top view of a multi-chamber sputtering apparatus.

It is a direct and effective method of saving production cycle time for fabricating WSi/$\alpha$-Si that a process of sputtering $\alpha$-Si and a process of sputtering WSi are all finished in a same apparatus. Thus, in the traditional art, a process of sputtering WSi finished first in one apparatus and then a process of sputtering $\alpha$-Si in the other apparatus, time required for venting of sputtering WSi and vacuuming of sputtering $\alpha$-Si can be saved in the present invention. Meanwhile, as described foregoing, a key factor that affects the low reflectivity of $\alpha$-Si is how to keep a wafer at low temperature during a sputtering process. Since a wafer is heated to a temperature of 300° C. during sputtering WSi it is very difficult to cool down the wafer in a high vacuum environment.

A sputtering apparatus used in the present invention is a multi-chamber sputtering apparatus, which allows one chamber used for sputtering WSi while another used for sputtering $\alpha$-Si. For example, a multi-chamber sputtering apparatus is a product of ANELVA, Japanese company and its top view is shown in FIG. 1. The letter A and G denote load and unload wafers respectively; the letter F denotes a preheat chamber in which a heated Ar gas is used as a heating source; the letter E denotes a Si sputtering chamber; and the letter D denotes a WSi sputtering chamber. All chambers are vacuumed when a sputtering process starts; thus a wafer is transported to another chamber immediately after a process of sputtering WSi is finished in the letter D chamber of FIG. 1. Since a sputtering process will heat the wafer, inert gas such as Ar is not heated by a heater as used in the letter F chamber of FIG.1 and blows the rear of the wafer for cooling down the wafer from 300° C. to low temperature such as room temperature at a pressure of about 13 mtorr. Then, a process of sputtering $\alpha$-Si is finished in the letter E chamber of FIG. 1 and inert gas such as Ar is kept flowing as a cooling source during the whole sputtering processes.

As a result, several features that the conventional art can not achieve are concluded as following.

1. Since sputtering WSi and sputtering $\alpha$-Si are separately finished in two sputtering apparatus in the conventional art it takes such time in vacuuming and venting of a sputtering process. But, in the present invention, sputtering WSi and sputtering $\alpha$-Si are finished in a same apparatus; therefore partial time of vacuuming and venting can be saved, thereby shortening the production cycle time, reducing the possibility of wafer contamination, raising production yield and reducing fabricating cost.
2. Since a process of wafer cooling after finishing a process of sputtering WSi is done in another a sputtering apparatus in the conventional art it further takes time and easily be contaminated by hand processing. However, in the present invention, a wafer is cooled down by the blowing of inert gas in sputtering apparatus, thereby shortening cooling time of a wafer and further reducing the possibility of wafer contamination.

Although the preferred embodiment of the invention has been disclosed for illustrative purposes, those skilled in the art will appreciate that various modifications, additions and substitutions are possible, without departing from the scope and spirit of the invention, as disclosed in the accompanying claims.

What is claimed is:

1. A method of in-situ wafer cooling for sequential sputtering WSi/α-Si, comprising the steps of:

sputtering a WSi layer on a wafer in a multi-chamber sputtering apparatus;

then, transporting the wafer to another chamber and cooling down the wafer by blowing of inert gas at the rear of the wafer; and sputtering an α-Si layer in condition of continuing blowing of inert gas.

2. A method of in-situ wafer cooling for sequential sputtering WSi/α-Si according to claim 1, wherein said inert gas is Ar.

* * * * *